(12) United States Patent
Min

(10) Patent No.: US 10,541,651 B2
(45) Date of Patent: Jan. 21, 2020

(54) MIXERS WITH IMPROVED LINEARITY

(71) Applicant: ANALOG DEVICES, INC., Norwood, MA (US)

(72) Inventor: Byungmoo Min, Lexington, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 15/835,155

(22) Filed: Dec. 7, 2017

(65) Prior Publication Data

US 2019/0020312 A1    Jan. 17, 2019

Related U.S. Application Data

(60) Provisional application No. 62/531,226, filed on Jul. 11, 2017.

(51) Int. Cl.
| | |
|---|---|
| *H03D 7/14* | (2006.01) |
| *H03D 7/16* | (2006.01) |
| *H03F 3/45* | (2006.01) |
| *H04B 1/04* | (2006.01) |
| *H04B 1/16* | (2006.01) |

(52) U.S. Cl.
CPC ........... *H03D 7/1491* (2013.01); *H03D 7/145* (2013.01); *H03D 7/1408* (2013.01); *H03D 7/1458* (2013.01); *H03D 7/165* (2013.01); *H03F 3/45278* (2013.01); *H04B 1/0475* (2013.01); *H04B 1/16* (2013.01); *H03D 2200/0023* (2013.01)

(58) Field of Classification Search
CPC ..................... H03D 7/02; H03D 7/125; H03D 7/1408–1491
See application file for complete search history.

(56) References Cited

U.S. PATENT DOCUMENTS

| | | | |
|---|---|---|---|
| 2,693,533 | A | 11/1954 | Femmer |
| 2,962,675 | A | 11/1960 | Meyer |
| 3,939,429 | A | 2/1976 | Lohn et al. |
| 4,125,810 | A | 11/1978 | Pavio |
| 4,601,063 | A | 7/1986 | Price |
| 4,817,200 | A | 3/1989 | Tanbakuchi |

(Continued)

FOREIGN PATENT DOCUMENTS

| | | |
|---|---|---|
| EP | 0308273 A1 | 3/1989 |
| EP | 0232560 B1 | 10/1990 |

OTHER PUBLICATIONS

U.L. Rohde and A.J. Poddar, "Reconfiguable and Cost-effective FET mixer", IEEE xplore, Wireless and Microwave Tech. Conf., Apr. 20-21, 2009.*

(Continued)

*Primary Examiner* — Edward F Urban
*Assistant Examiner* — Rui M Hu
(74) *Attorney, Agent, or Firm* — Knobbe, Martens, Olson & Bear, LLP

(57) ABSTRACT

Systems and methods are disclosed for improved linearity performance of a mixer. An example mixer includes switching circuit elements configured to be switched on and switched off based at least partly on a local oscillator signal and capacitors including a respective capacitor in parallel with each of the switching elements. The mixer is configured to mix the input signal with the local oscillator signal to thereby frequency shift the input signal.

20 Claims, 8 Drawing Sheets

(56) References Cited

U.S. PATENT DOCUMENTS

| | | | |
|---|---|---|---|
| 5,060,298 A | 10/1991 | Waugh et al. | |
| 5,157,786 A | 10/1992 | Muterspaugh | |
| 5,361,409 A | 11/1994 | Vice | |
| 5,438,693 A * | 8/1995 | Cox | H03D 7/145 |
| | | | 327/355 |
| 5,551,076 A * | 8/1996 | Bonn | H03D 7/125 |
| | | | 327/113 |
| 5,678,224 A | 10/1997 | Murtojarvi | |
| 5,697,092 A * | 12/1997 | Mourant | H03D 7/125 |
| | | | 455/323 |
| 5,854,974 A * | 12/1998 | Li | H03D 7/1408 |
| | | | 455/330 |
| 6,078,802 A | 6/2000 | Kobayashi | |
| 6,118,992 A | 9/2000 | Watanabe | |
| 6,140,849 A | 10/2000 | Trask | |
| 6,810,241 B1 | 10/2004 | Salib | |
| 6,895,224 B1 | 5/2005 | Munday et al. | |
| 6,993,312 B1 | 1/2006 | Salib | |
| 7,020,452 B1 | 3/2006 | Kobayashi | |
| 7,031,687 B2 | 4/2006 | Kivekäs et al. | |
| 7,035,616 B2 | 4/2006 | Reynolds | |
| 7,043,220 B1 * | 5/2006 | Ciubotaru | H03D 7/1425 |
| | | | 327/113 |
| 7,072,636 B2 * | 7/2006 | Dobrovolny | H03D 7/1408 |
| | | | 455/313 |
| 7,095,989 B2 * | 8/2006 | Karlquist | H03D 7/02 |
| | | | 455/127.1 |
| 7,580,693 B2 * | 8/2009 | Rohde | H03D 7/1441 |
| | | | 455/313 |
| 7,643,808 B2 * | 1/2010 | Knopik | H03D 7/125 |
| | | | 455/189.1 |
| 7,668,527 B2 | 2/2010 | Vaisanen | |
| 8,331,897 B2 | 12/2012 | Kim et al. | |
| 8,441,304 B2 * | 5/2013 | Kinoshita | H03K 17/693 |
| | | | 327/427 |
| 9,130,508 B1 | 9/2015 | Kang et al. | |
| 9,780,728 B1 * | 10/2017 | Salameh | H03D 7/1458 |
| 9,793,856 B1 * | 10/2017 | Esmael | H03D 7/1408 |
| 2004/0224658 A1 | 11/2004 | Borremans | |
| 2004/0242178 A1 * | 12/2004 | Kim | H03D 7/145 |
| | | | 455/234.1 |
| 2005/0088204 A1 | 4/2005 | Behzad | |
| 2005/0191985 A1 * | 9/2005 | Bos | H04B 1/0475 |
| | | | 455/326 |
| 2006/0040637 A1 * | 2/2006 | Kanaya | H03D 9/0633 |
| | | | 455/331 |
| 2007/0018507 A1 * | 1/2007 | Knopik | H03D 7/125 |
| | | | 307/127 |
| 2007/0066269 A1 | 3/2007 | Kivekas et al. | |
| 2008/0012610 A1 * | 1/2008 | Aoki | H01L 27/0255 |
| | | | 327/109 |
| 2008/0227409 A1 * | 9/2008 | Chang | H04B 1/525 |
| | | | 455/78 |
| 2008/0248776 A1 * | 10/2008 | Banba | H03D 7/1441 |
| | | | 455/327 |
| 2009/0163156 A1 * | 6/2009 | Rofougaran | H03C 5/00 |
| | | | 455/127.1 |
| 2009/0181634 A1 * | 7/2009 | Jung | H03D 7/125 |
| | | | 455/333 |
| 2009/0262861 A1 * | 10/2009 | Nielsen | H03C 3/40 |
| | | | 375/296 |
| 2009/0325529 A1 * | 12/2009 | Yang | H04B 17/21 |
| | | | 455/296 |
| 2012/0280742 A1 | 11/2012 | Chattopadhyay et al. | |
| 2013/0049881 A1 * | 2/2013 | Iida | H03H 19/004 |
| | | | 333/101 |
| 2014/0247912 A1 * | 9/2014 | Lv | H04L 27/364 |
| | | | 375/348 |
| 2015/0044979 A1 * | 2/2015 | Seckin | H04B 1/0475 |
| | | | 455/114.2 |
| 2016/0248454 A1 * | 8/2016 | Li | H03F 1/3247 |
| 2017/0302226 A1 * | 10/2017 | Esmael | H03D 7/1408 |

OTHER PUBLICATIONS

Linear Technology, "Very High Linearity Active Mixer," Datasheet for LT5521, pp. 1-16, dated 2004 (available at: http://cds.linear.com/docs/en/datasheet/5521f.pdf; accessed: Nov. 4, 2016).

Trask, "Mixer Musings and the Kiss Mixer," Mixer Musings Rev B, Jan. 22, 2012, pp. 1-15, (available at: www.mikrocontroller.net/attachment/146369/Mixer_Musings.pdf; accessed: Nov. 4, 2016).

Franceschino, "An IF Communication Circuit Tutorial," Motorola Semiconductor Application Information, 1996, pp. 1-7 (available at: http://www.nxp.com/files/rf_if/doc/app_note/AN1539.pdf; accessed: Nov. 4, 2016).

Rashtian, "On the Use of Body Biasing to Improve the Performance of CMOS RF Front-End Building Blocks," Thesis Submitted in Partial Fulfillment of the Requirements for the Degree of Doctor of Philosophy in Electrical and Computer Engineering at the University of British Columbia, Jul. 2013, pp. 1-198 (available at: https://open.library.ubc.ca/media/download/pdf/24/1.0074003/1/1582; accessed: Nov. 4, 2016).

Rubiola, "Tutorial on the double balanced mixer," Feb. 2, 2008, pp. 1-52 (available at: https://arxiv.org/pdf/physics/0608211.pdf; accessed: Nov. 4, 2016).

Trask, "A Linearized Active Mixer," Proceedings of the RF Design '98 Conference, San Jose, California, Oct. 1998, pp. 13-24 (available at: http://home.earthlink.net/~christrask/RFDES98.pdf; accessed: Nov. 4, 2016).

Niknejad, "Current/Voltage Commutating Mixers," 2015, pp. 1-50, U.C. Berkeley, California (available at: http://rfic.eecs.berkeley.edu/142/pdf/lect22_iv_mixers.pdf; accessed: Nov. 4, 2016).

European Search Report Issued for Application No. EP 18181229.0 dated Dec. 4, 2018 in 8 pages.

Pustovarov V Y et al. "A Broadband Twin Balanced Microwave Mixer in Integrated Form Based on Two-Wire Transmission Lines", Telecommunications and Radio Engineering, Scripta Technica, Inc., New York, NY, US, vol. 41/42, No. 2, Feb. 28, 1987, p. 28/29, XP000021397, ISSN: 0040-2508.

Office Action with Translation Issued for Taiwan Application No. 107123832 dated Mar. 18, 2019, in 15 pages.

Office Action with Translation Issued for Taiwan Application No. 107123832 dated Jun. 27, 2019, in 13 pages.

* cited by examiner

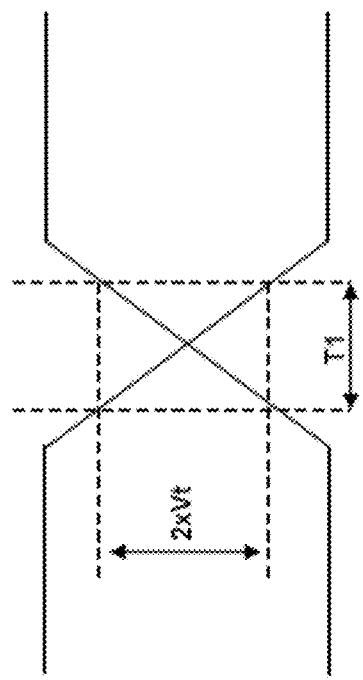
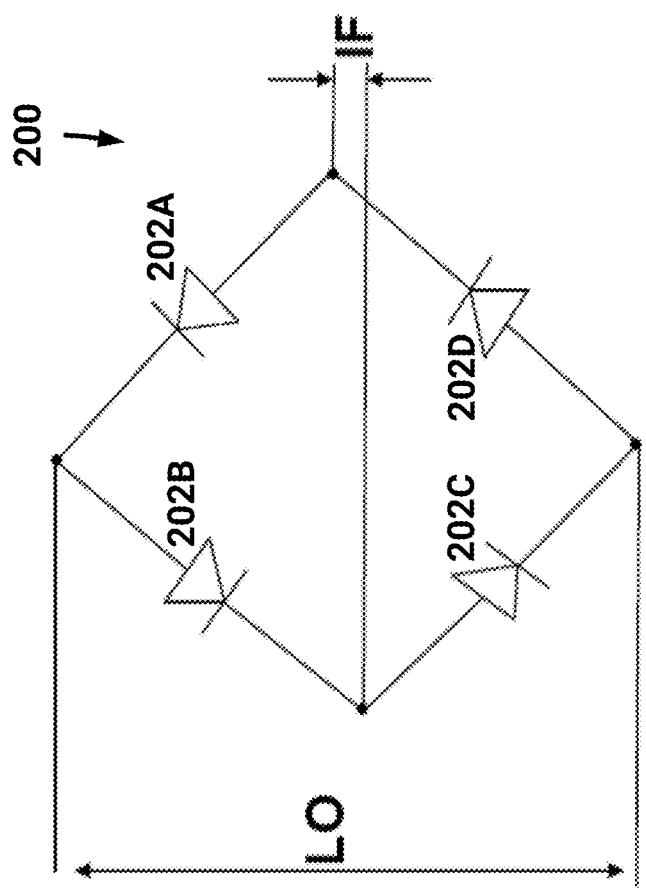
FIG. 2B
FIG. 2A under any claims, whether independently or combined with
MIXERS WITH IMPROVED LINEARITY

CROSS-REFERENCE TO RELATED APPLICATION

Any and all applications for which a foreign or domestic priority claim is identified in the Application Data Sheet as filed with the present application are hereby incorporated by reference in their entirety under 37 CFR 1.57. This application claims the benefit of priority of U.S. Provisional Patent Application No. U.S. 62/531,226, filed Jul. 11, 2017 and titled "MIXERS WITH IMPROVED LINEARITY", the disclosure of which is hereby incorporated by reference in its entirety herein.

FIELD OF THE DISCLOSURE

The described technology generated relates to electronics and, more specifically, to mixers.

BACKGROUND

Mixers are often used in various circuits such as radio frequency (RF) receivers and transmitters for functions such as down converting or up converting. Generally, for mixers, such as diode ring mixer or field effect transistor (FET) ring mixers, linearity is a significant characteristic that affects, for example, cross modulation, desensitization, harmonic generation, gain compression, and degradation in the signal-to-noise and distortion ratio (SNDR). Due to various inherent non-linear characteristics of mixer elements, such as diodes or transistors, and various other design considerations and trade-offs in mixer design, improving linearity of a mixer can be challenging.

SUMMARY OF THE DISCLOSURE

The innovations described in the claims each have several aspects, no single one of which is solely responsible for its desirable attributes. Without limiting the scope of the claims, some prominent features of this disclosure will now be briefly described.

In an embodiment, a mixer includes switching circuit elements configured to be switched on and switched off based at least partly on the local oscillator signal. The mixer includes capacitors comprising a respective capacitor in parallel with each of the switching elements. The mixer is configured to mix the input signal with the local oscillator signal to thereby frequency shift the input signal.

The switching circuit elements can be diodes. The mixer can be a double balanced diode mixer. The switching circuit elements can be field effect transistors. A respective gate can be electrically connected to a respective drain of each field effect transistor of the field effect transistors. The mixer can include resistors arranged such that each of the switching elements is in parallel with a series circuit, the series circuit comprising a capacitor of the capacitors in series with a resistor of the resistors. The mixer can be a passive mixer. The mixer can include an input balun coupled to at least one of the switching circuit elements. The mixer can include an additional capacitor coupled across differential ports of the input balun. The mixer can include an output balun configured to provide the frequency shifted input signal.

According to an embodiment, a mixer includes diodes configured to switch based at least partly on the local oscillator signal and capacitors, each of which is arranged in parallel with a respective diode of the diodes. The mixer is configured to mix the input signal with the local oscillator signal to thereby frequency shift the input signal.

The mixer is a double balanced diode mixer. The diodes comprise at least 4 diodes. The mixer includes resistors, each of which is included in a series RC circuit that also includes a capacitor of the capacitors and is in parallel with a diode of the diodes. Each diode is a diode-connected field effect transistor. The mixer includes an input balun coupled to at least one of the diodes.

According to an embodiment, a method for mixing an input signal with a local oscillator (LO) signal with improved linearity. The method includes receiving, at inputs of a mixer, the input signal and the LO signal; and mixing, with switching elements of the mixer, the input signal and the LO signal to generate a frequency shifted input signal, wherein the switching elements and the capacitors are arranged such that leakage current flows across the switching elements during a zero crossing transition time of the LO signal to improve linearity of the mixer The switching elements are arranged in a ring, and each capacitor of the capacitors is in parallel with a respective switching element of the switching elements. The mixer includes a series combination of a capacitor of the capacitors and a resistor in parallel with each of the switching element. The method further comprises providing the input signal to the mixer with an amplifier having a gain arranged to compensate for conversion gain of the mixer.

BRIEF DESCRIPTION OF THE DRAWINGS

The following drawings and the associated description herein are provided to illustrate specific embodiments of the disclosure and are not intended to be limiting.

FIG. 2A illustrates switching diodes of an example double balanced mixer.

FIG. 2B illustrates a timing diagram of the LO signal for the example mixer.

DETAILED DESCRIPTION

Figure 1A:
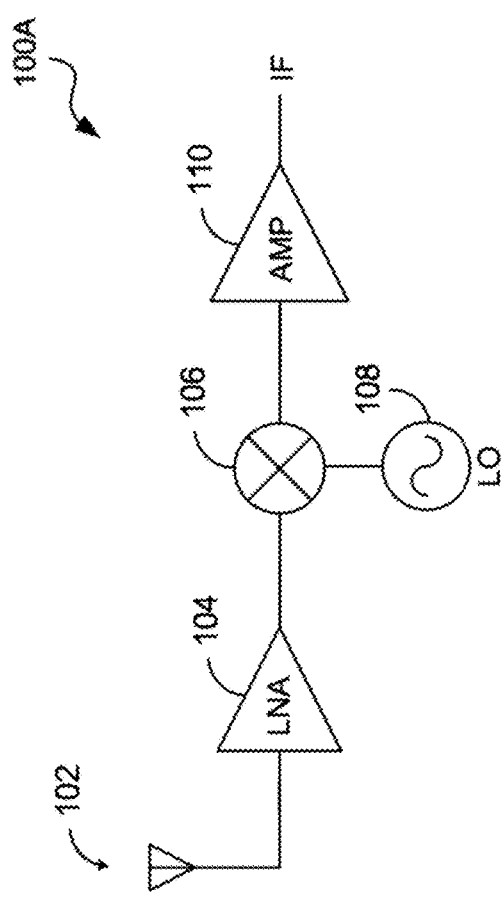
FIG. 1A is a diagram of an example implementation of the technology disclosed herein in a receiver according to one embodiment.

Various aspects of the novel systems, apparatuses, and methods are described more fully hereinafter with reference to the accompanying drawings. Aspects of this disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the novel systems, apparatuses, and methods disclosed herein, whether implemented independently of or combined with any other aspect. For example, an apparatus may be implemented or a method may be practiced using any number of the aspects set forth herein. In addition, the scope is intended to encompass such an apparatus or method which is practiced using other structure, functionality, or structure and functionality in addition to or other than the various aspects set forth herein. It should be understood that any aspect disclosed herein may be embodied by one or more elements of a claim.

Although particular aspects are described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to any systems and/or devices that could benefit from a mixer with improved linearity. The detailed description and drawings are merely illustrative of the disclosure rather than limiting, the scope of the disclosure being defined by the appended claims and equivalents thereof.

In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Mixers are often used in various circuits, such as radio frequency (RF) receivers and transmitters, for functions such as down converting or up converting of signals (e.g., conversion of an RF signal up or down in frequency). Passive mixers can include switching diodes and baluns, and can process local oscillator (LO), radio frequency (RF), and intermediate frequency (IF) signals. The mixers can further include switching elements, such as diodes or transistors (e.g., field effect transistors). In some instances, a turn-on voltage of the switching diodes can be about 0.7 Volts (V). Thus, a LO signal amplitude of 1.4 V or higher can turn on such switching diodes. During the time during which the LO signal is transitioning and less than 1.4 V, the switching diodes may experience no current path, which can cause non-linearity in the mixer due to discontinuity of the IF and RF signals. This disclosure provides technical solutions to improve linearity of such a mixer.

Commonly, mixers include non-linear elements such as diodes, field effect transistors, and the like. Due to use of these non-linear elements, linearity is a significant characteristic for mixers. Linearity can affect, for example, cross modulation, desensitization, harmonic generation, gain compression, degradation in the signal-to-noise and distortion ratio (SNDR), or any combination thereof. Due to various non-linear characteristics of mixer elements, such as diodes, and various other design considerations and trade-offs in mixer design, improving linearity of a mixer can be challenging.

Some efforts to linearize a mixer have involved stacking a switching diode in series or adding passive resistors in series with switching diodes. While these may result in linearity gains, such efforts can involve a higher local oscillator (LO) amplitude to turn on switching diodes. These designs can therefore be impractical to implement in various applications. As an example, an application in which lower amplitude signals are commonly utilized such as in cell phone wireless transmissions. Other efforts have involved resistors solely in parallel with switching diodes. These designs may result in higher noise figures, and again may be impractical for particular applications.

Example mixers with improved linearity are described below, for example in FIGS. 3A-3E, with the example mixers including capacitors coupled in parallel with switching elements (e.g., diodes and/or field effect transistors). For example, a relatively small capacitor may be coupled in parallel with each switching diode of a mixer. By adding such a capacitor in parallel with each switching-diode, a relatively small amount of leakage current can flow during a zero-crossing transition time of a local oscillator (LO) signal. Accordingly, this can compensate for a discontinuity issue discussed above, which may be present without capacitors in parallel with switching diodes. With such compensation, linearity characteristic parameters, such as an input $3^{rd}$ order intercept point (IIP3) and/or an output $3^{rd}$ order intercept point (OIP3) and/or 1-dB compression point (P1 dB), can be improved. An example simulation of such an improvement is illustrated in FIG. 4.

FIG. 1A is a diagram of an example implementation of the technology disclosed herein in a receiver 100A according to one embodiment. The illustrated receiver 100A includes an antenna 102, a low noise amplifier (LNA) 104, a mixer 106, a local oscillator 108, and an amplifier 110. In certain embodiments, the LNA 104, the mixer 106, and the amplifier 110 can be included on a single integrated circuit. A low pass filter may be included between the mixer 106 and the amplifier 110. The antenna 102 and/or the local oscillator 108 can be external or internal to the integrated circuit. It will be understood that the receivers and/or the transmitters illustrated in FIGS. 1A-1B may include fewer or more elements than illustrated. In certain implementations, the receivers and/or transmitters disclosed herein can include additional elements or components, such as baluns or transformers for providing differential or single-ended signals, intermediate frequency (IF) bandpass filters for filtering out unwanted harmonics, etc. As another example, any of the illustrated antennas can be used for both transmitting RF signals and receiving RF signals and a switch can selectively electrically connect a transmit path or a receive path to such an antenna. As described herein, same or corresponding numerals and/or names of elements in FIGS. 1A-4 and their descriptions indicate the elements having similar or corresponding functionalities and/or characteristics.

The illustrated receiver 100A can receive an RF signal at the antenna 102, and the RF signal can be provided to the LNA 104. An RF signal can have a frequency in the range from about 30 kHz to 300 GHz, such as in a range from about 450 MHz to about 6 GHz for certain communications standards. The LNA 104 can amplify the received RF signal and provide the amplified RF signal to the mixer 106. The local oscillator 110 can provide a local oscillator signal to the mixer 106. In some implementations, the local oscillator 108 can provide a differential local oscillator signal to the mixer 106. The amplifier 110 receives a mixer output from the mixer 106, and the amplifier 112 may output an amplified IF signal for further processing.

Figure 1B:
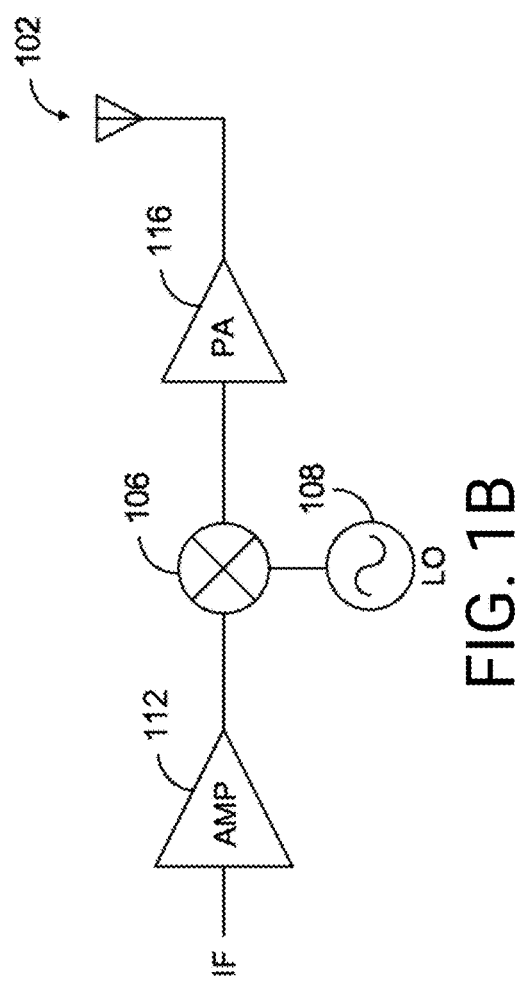
FIG. 1B is a diagram of another example implementation of the technology disclosed herein in a transmitter according to one embodiment.

The mixers 106 illustrated in FIGS. 1A-1B may be single-ended. In some embodiments, the mixers disclosed herein can be implemented as a partially or fully differential mixer receiving differential signal input, differential LO input, and/or producing differential signal output. In some embodiments, the mixers disclosed herein can be implemented with a passive mixer, ring mixer, H-bridge mixer, unbalanced mixer with a single mixing element, double-balanced mixer, and/or Gilbert cell mixer, for example. In some embodiments, the mixers disclosed herein can be implemented with rectifiers or diodes, such as P-N junction diodes, Schottky barrier diodes, GaAs diodes, semiconductor diodes, or the like. In some embodiments, the mixers disclosed herein can be implemented with field effect transistors (FETs), such as metal oxide semiconductor (MOS) transistors, which can be in complementary form, junction field effect transistors (JFETs), laterally diffused metal oxide semiconductor (LDMOS) transistors, GaAs metal semiconductor field effect transistors (GaAs MESFETs), pseudomorphic high electron mobility transistors (pHEMTs), or the like. While the terms "metal" and "oxide" may be present in for example, MOS, such transistors can have gates made out of materials other than metals, such as polysilicon, and have dielectric oxide regions made from dielectrics other than silicon oxide, such as a high-κ dielectric. According to some other embodiments, mixers implemented in accordance with the principles and advantages discussed herein can be with bipolar transistors, such as SiGe bipolar transistors or GaAs heterojunction bipolar transistors. According to certain embodiments, the capacitors described herein can be on the same die as the switching circuit elements of the mixer.

FIG. 1B is a diagram of another example implementation of the technology disclosed herein in a transmitter according to one embodiment. The illustrated transmitter 100B includes an amplifier 112, the mixer 106, the local oscillator 108, a power amplifier 116, and the antenna 102. In certain embodiments, the amplifier 112, the mixer 106, and the power amplifier 116 can be included on an integrated circuit. A band pass filter may be included between the mixer 106 and the amplifier 116. The antenna 102 and the local oscillator 108 can be external to or part of the integrated circuit.

The illustrated transmitter 100B includes the amplifier 112 that receives an IF signal and outputs an amplified IF signal to the mixer 106. The local oscillator 108 can provide a local oscillator signal to the mixer 106. In some implementations, the local oscillator 108 can provide a differential local oscillator signal to the mixer 106. The power amplifier 116 receives a mixer output from the mixer 106, and the power amplifier 116 provides an amplified RF signal to the antenna 102 to be transmitted.

The mixers 106 in the illustrated circuits 100A, 100B in FIGS. 1A-1B can be implemented with example mixers 300A-300E illustrated in, and described in connection with, FIGS. 3A-3E below. Any suitable combination of the principles and advantages of any of FIGS. 3A-3E can be implemented in a mixer 106 of FIG. 1A and/or FIG. 1B.

FIG. 2A illustrates switching diodes of an example double balanced mixer 200. The example mixer 200 includes diodes 202A-202D arranged as a ring modulator. The mixer 200 is configured to receive a local oscillator (LO) signal and an intermediate frequency (IF) signal. FIG. 2B, described below, illustrates a timing diagram of the LO signal for the mixer 200.

FIG. 2B illustrates a timing diagram of the LO signal for the mixer 200. Depending on diode technology, during the cross-over time T1 indicated in FIG. 2B, all diodes 202A-202D of the mixer of FIG. 2A can be turned off. Each of these diodes may have a turn-on voltage $V_t$. As shown in FIG. 2B, the diodes can be off as the LO signal voltage transitions by twice the magnitude of the turn-on voltage $V_t$ of the diodes. Accordingly, the IF signal of the mixer 200 can experience a temporal discontinuity, which can degrade linearity (e.g., IIP3) of the mixer 200.

Inclusion of capacitors in parallel with the diodes 202A-202D, or other switching elements (e.g., the field effect transistors of FIG. 3C), can improve linearity as described below with respect to FIGS. 3A-4. Since the mixer 200 does not include such parallel capacitors, the mixer 200 can have degraded linearity performance compared to the mixers described herein with respect to FIGS. 3A-3E.

Figure 3A:
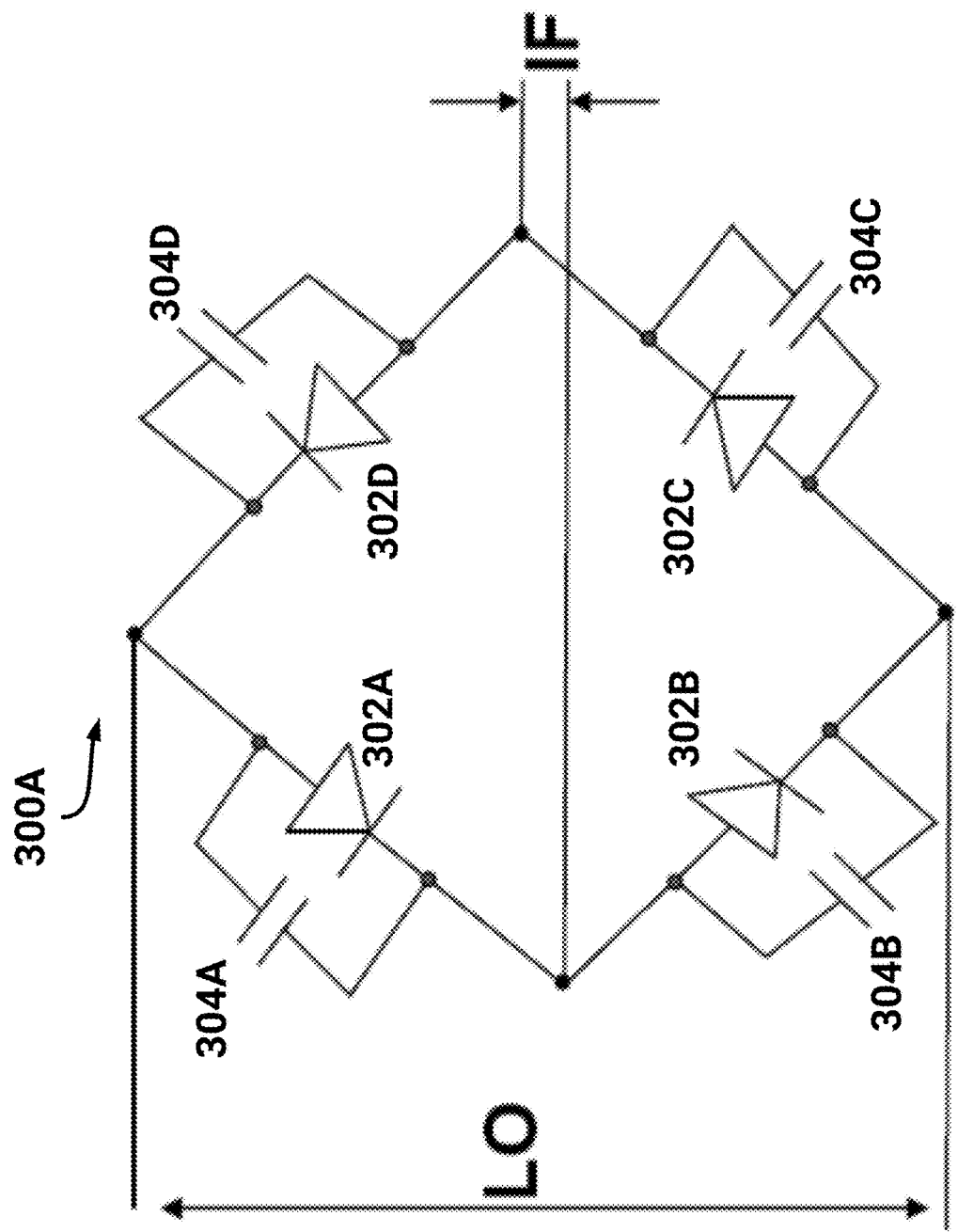
FIG. 3A is a schematic diagram of an example mixer according to an embodiment.
Figure 3B:
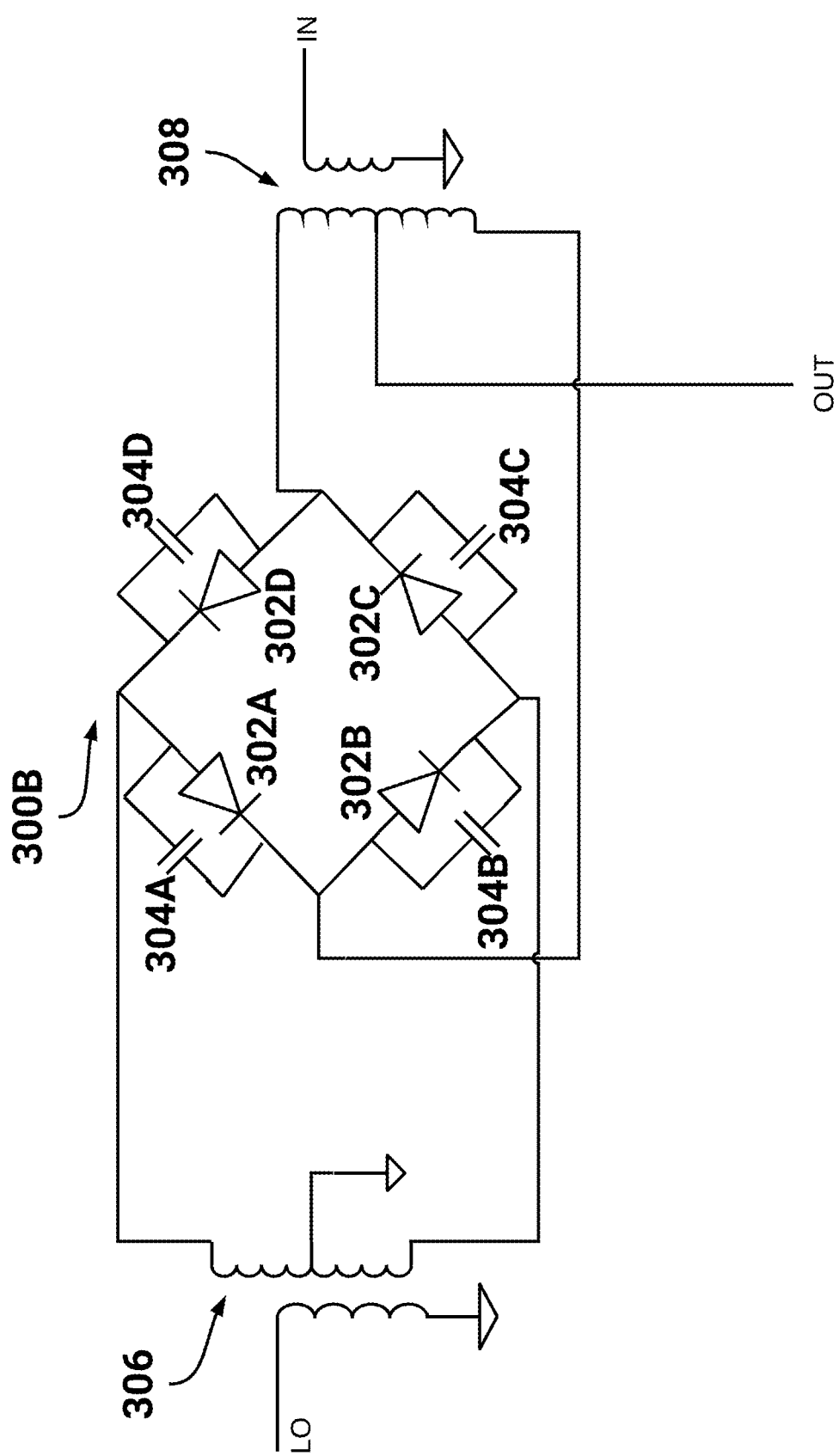
FIG. 3B is a schematic diagram of the example mixer according to another embodiment.
Figure 3E:
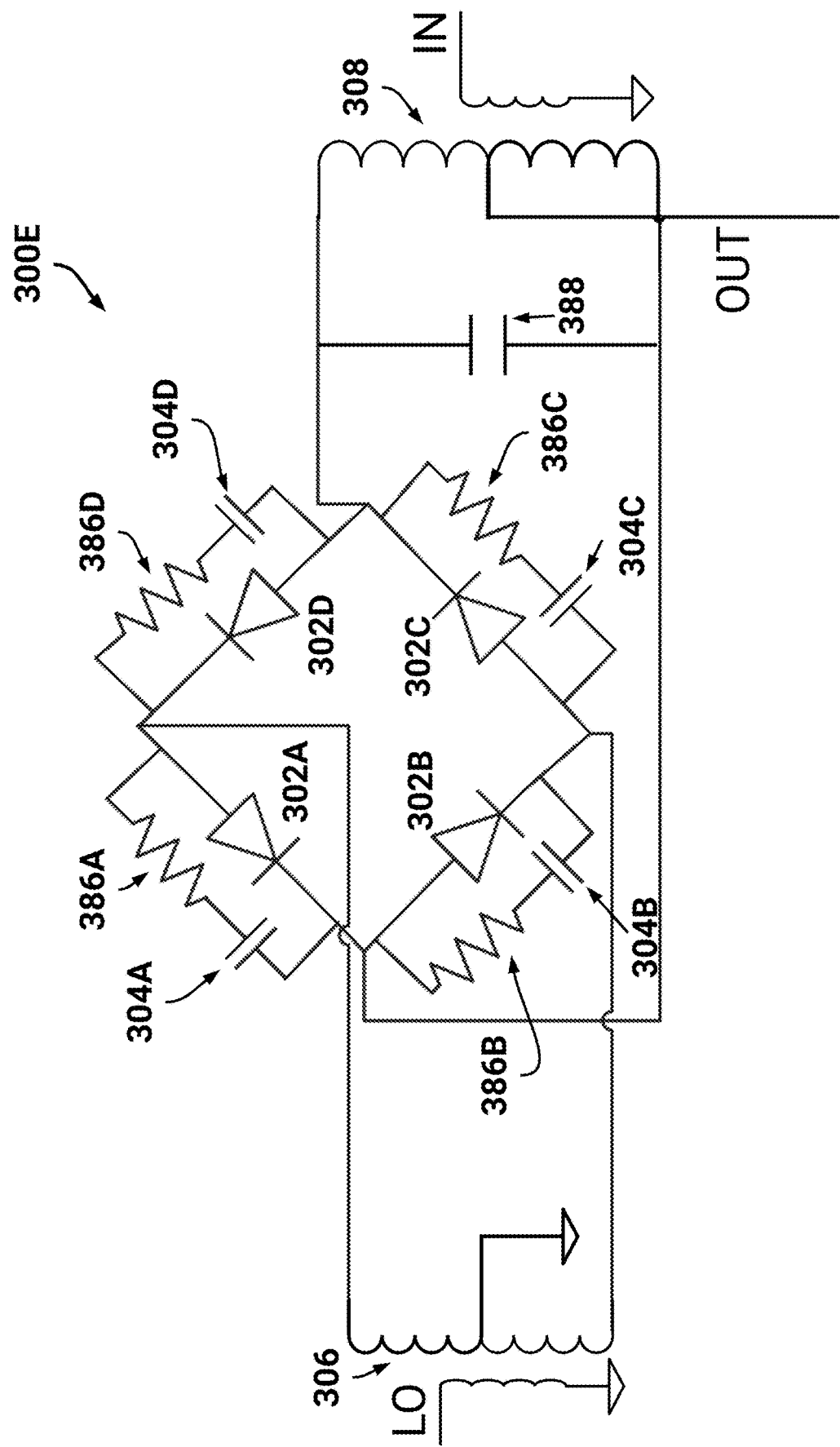
FIG. 3E is a schematic of a mixer according to another embodiment.
Figure 4:
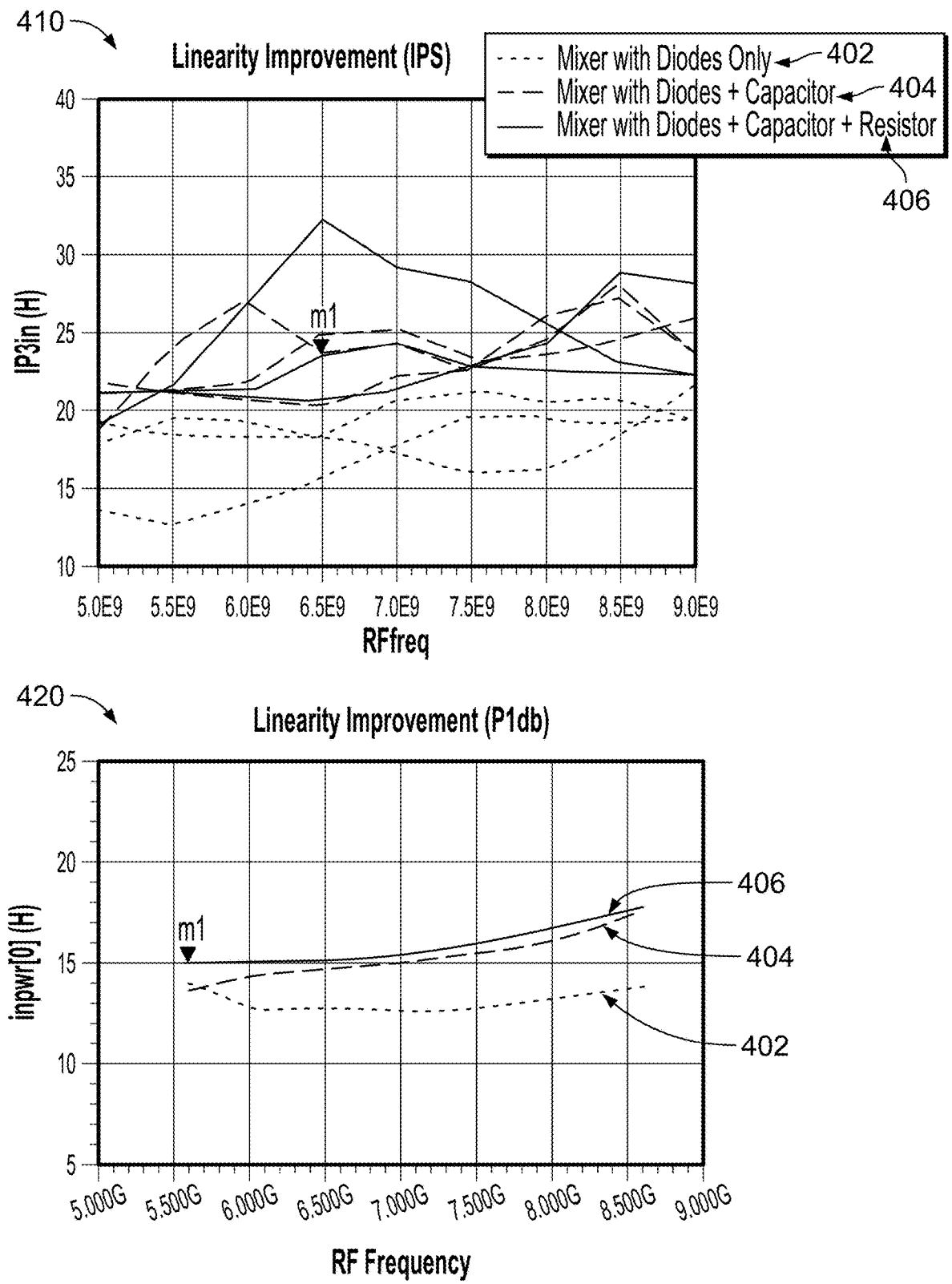
FIG. 4 illustrates an example simulation showing linearity improvement for disparate mixers.

FIG. 3A is a schematic diagram of an example mixer 300A according to an embodiment. The illustrated mixer 300A is a double balanced mixer. The mixer 300A can frequency translate an input signal by 100s of MHz in certain instances. According to some other instances, the mixer 300A can frequency translate an input signal by 1 GHz to 10 GHz. As illustrated, mixer 300A includes switching elements (e.g., diodes 302A-302D) each in parallel with a respective capacitor (e.g., capacitors 304A-304D, respectively) that form a ring. The diodes 302A-302D can be any suitable circuit elements configured to function as a diode, such as semiconductor diodes or diode-connected transistors). Capacitors 304A-304D, as shown in FIGS. 3A, 3B, and 3E, are explicit capacitors rather than parasitic capacitors. As described herein, a "ring" mixer generally refers to a mixer having its mixing elements (typically four elements) arranged in a shape of a ring to mix or modulate an input signal with a carrier signal or local oscillator signal to generate an output signal. As described above, through inclusion of a capacitor in parallel with each diode of the mixer 300A, the IF signal can reduce and/or eliminate a temporal discontinuity during the LO signal crossover time T1 indicated in FIG. 2B. Accordingly, the linearity (e.g., IIP3) of the mixer 300A can be improved relative to the mixer 200. This improvement can be provided up to a given process technology limit.

Each capacitor 304A-304D may have a relatively small capacitance, such as a capacitance in a range from 25 fF to 50 pF. With such relatively small capacitances, mixing conversion gain reduction from inclusion of capacitors 304A-304D can be constrained, while enabling increases in linearity as described herein. The specific capacitance selected for the mixer 300 can be based on a size of the diodes 302A-302D. Additionally, the specific capacitance can be based on the size of the RF to IF balun (e.g., illustrated in FIG. 3B). A low noise amplifier (LNA) may can provide gain (e.g., LNA 104 illustrated in FIG. 1A) so as to compensate for mixer conversion gain lost via utilization of the capacitors 304A-304D. That is, design (e.g., optimization) of diode size and/or the RF-to-IF balun and/or amplifier gain (e.g., low noise amplifier gain) can compensate for possible reduction in conversion gain associated with the capacitors in parallel with respective switching elements in the embodiments of FIGS. 3A-3E.

FIG. 3B is a schematic diagram of mixer 300B according to another embodiment. As illustrated, the mixer 300B of FIG. 3B includes baluns 306, 308, and the features of the mixer 300A of FIG. 3A. For example, local oscillator (LO) balun 306 and an input signal balun 308 are illustrated in combination with the elements of the mixer 300A of FIG. 3A.

Parallel capacitors 304A-304D are coupled in parallel to the signal path, thus improving linearity via enabling a relatively small amount of leakage current to flow during a zero-crossing transition time of the LO signal 312. Accordingly, the LO signal LO and the Input signal IN can be mixed, and an output signal OUT with improved linearity can be tapped off from the input signal balun 308. The illustrated input signal IN can be an IF signal or an RF signal. The illustrated output signal OUT can be the input signal IN multiplied by the LO signal. Accordingly, the output signal OUT can be frequency shifted relative to the input signal IN. The illustrated ports for the input signal IN and the output signal OUT can be switched with each other depending on the application. Accordingly, in certain applications, the signal labeled OUT in FIG. 3B can be an input signal, and the signal labeled IN can be an output signal.

Figure 3C:
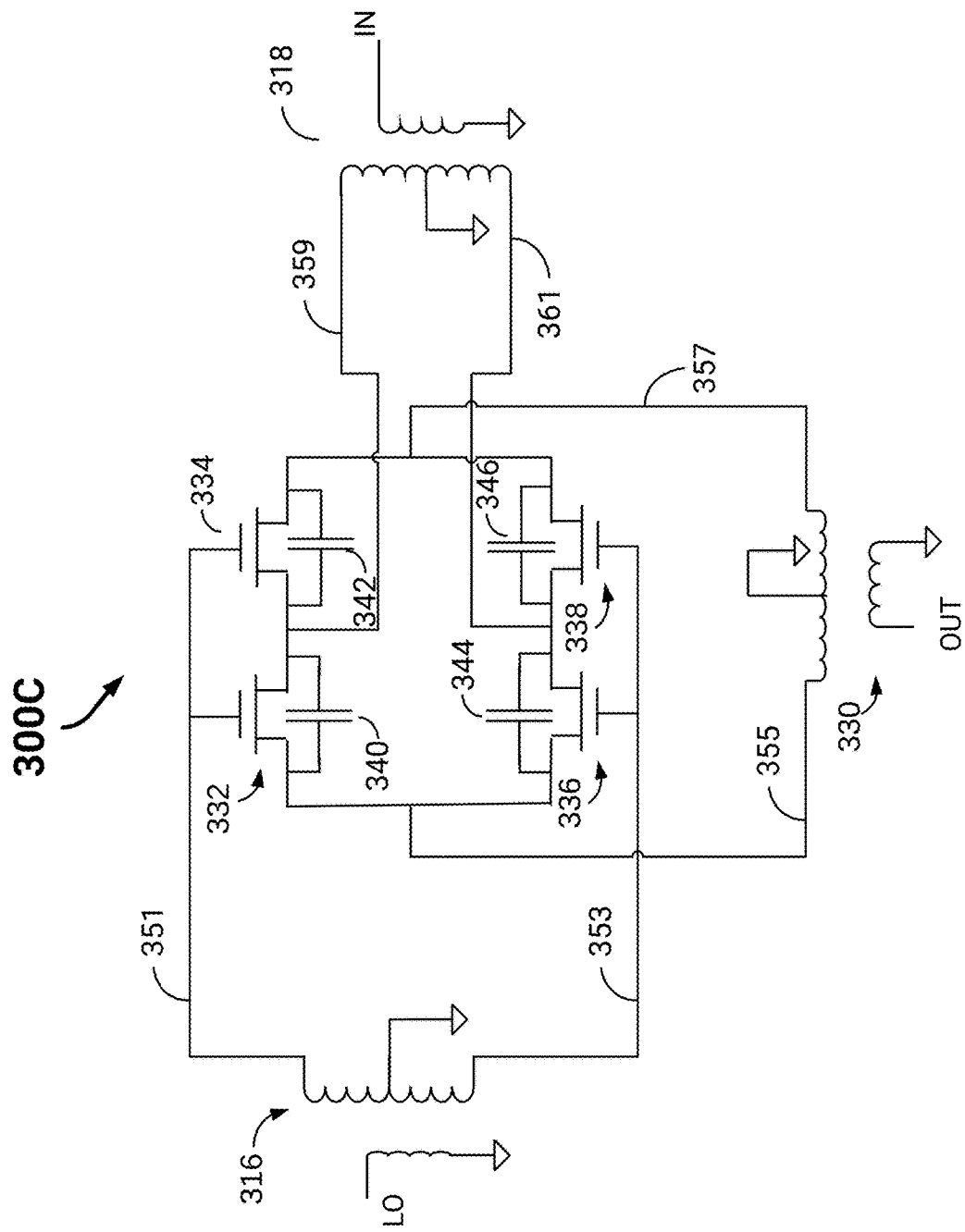
FIG. 3C is a schematic diagram of a mixer according to another embodiment.

FIG. 3C is a schematic diagram of a mixer 300C according to another embodiment. The illustrated mixer 300C includes transistors 332, 334, 336, and 338 implementing switching circuit elements that form a ring. Capacitors 340, 342, 344, and 346 are respectively coupled in parallel with the transistors 332-338 between the source and the drain of the respective transistors 332-338. As illustrated in FIG. 3C, the gates of the transistors 332-338 of the mixer ring are coupled to the LO balun 316 at nodes 351, 353, and the mixer ring is coupled to the input signal balun 318 at nodes 359, 361, and an output signal balun 330 at nodes 355, 357.

Although the illustrated mixer 300C in FIG. 3C is implemented with FET transistors (e.g., NFET), the mixer 300C can be any passive H-bridge ring mixer, quad FET mixer, or a FET ring mixer, or other suitable FET-based mixer, which can be implemented, for example, with NFET and/or PFET transistors. In a passive mixer, each transistor can operate as a switch that is either on or off. The transistors for a passive mixer can electrically connect two nodes when on and electrically isolate the two nodes when off. In a passive mixer, transistors can be periodically turned on and off to mix signals. A passive mixer can be in series with an active circuit and pass DC current of the active circuit. The differential LO signal from the LO balun 316 at the nodes 351, 353 can turn different transistors 332-338 of the mixer ring on and off. The mixer ring can alternatingly connect the differential input from the input signal balun 318 at the differential input nodes 359, 361 to the differential output nodes 355, 357 of the mixer ring. The output signal balun 330 converts or transforms the differential output signals at the nodes 355, 357 to produce the output signal, OUT, which is effectively the input signal, IN, multiplied by the LO signal, LO. It is to be noted that the mixer 300B can be partially or fully differential, receiving and/or producing differential input, LO, and/or output signals.

Figure 3D:
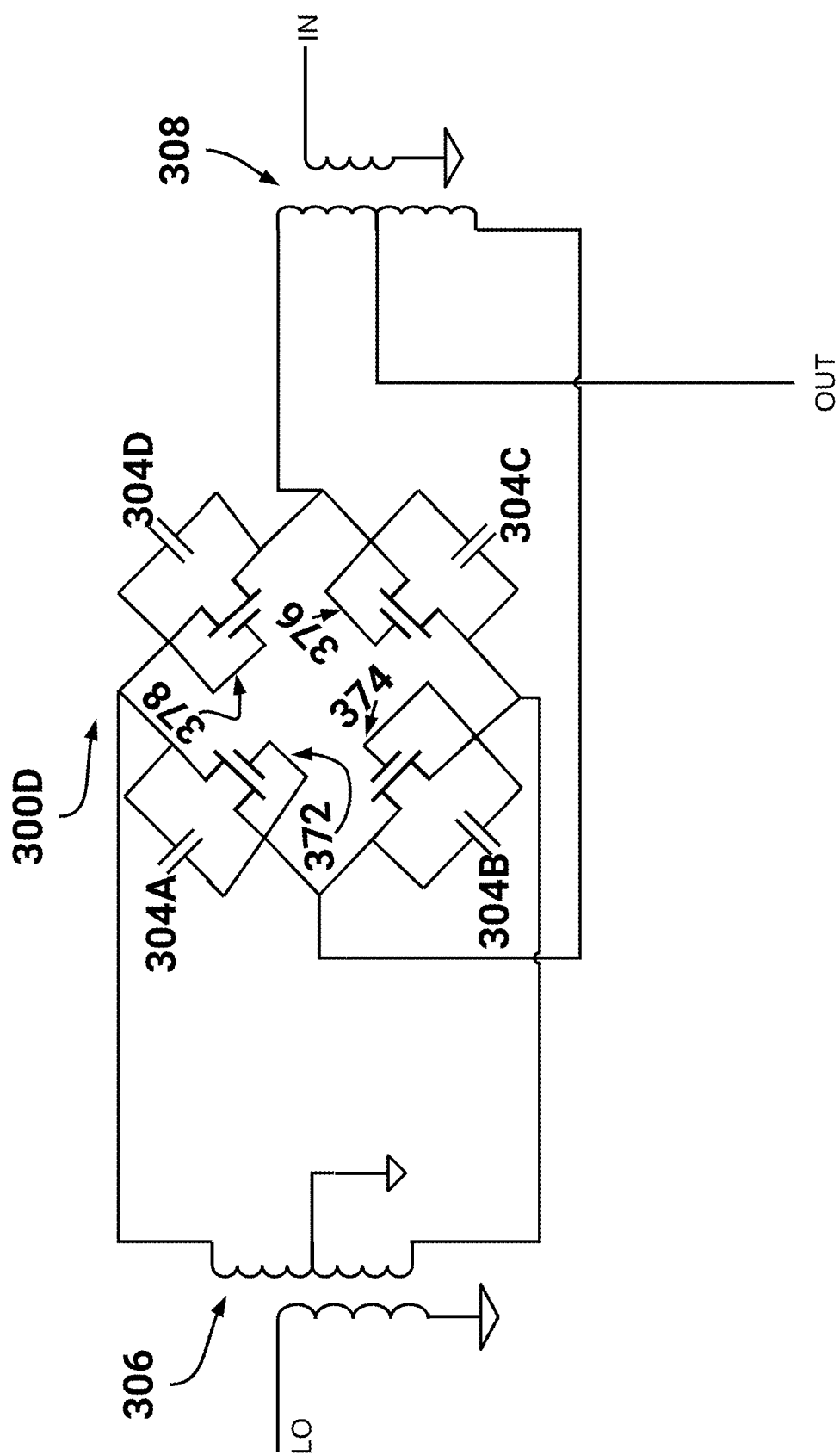
FIG. 3D is a schematic diagram of a mixer according to another embodiment.

FIG. 3D is a schematic diagram of a mixer 300D according to another embodiment. The mixer 300D is similar to the mixer 300B, except that it includes transistors 372-378 which are each electrically connected to be a diode connected transistor. For example, the gate and drain of each transistor can be electrically connected to each other.

FIG. 3E is a schematic diagram of a mixer 300E according to another embodiment. The mixer 300E of FIG. 3E is similar to mixer 300A of FIG. 3A, but includes a series combination of a capacitor and a resistor in parallel with each switching element (e.g., diodes 302A-302D). Additionally, the mixer 300E includes baluns, for example local oscillator (LO) balun 306 and input signal balun 308 are illustrated. In some embodiments, the mixer 300E may include a capacitor in parallel with a balun (e.g., capacitor 388 is illustrated in the example of FIG. 3E).

The series combination of the capacitor and resistor in parallel with each diode can further improve linearity relative to a capacitor in parallel with each diode. While the illustration of FIG. 3E includes diodes, it should be understood that the diodes may be replaced with transistors such that each transistor can be in parallel with a respective series combination of a capacitor and resistor.

As illustrated, diodes 302A-302D are connected in parallel to a respective series combination of capacitors 304A-304D and resistors 386A-386D. The illustrated resistors 386A-386D are explicit resistors rather than parasitic resistors. A resistance selected or determined for each resistor 386A-386D can be based on features of the mixer 300E, and particular performance characteristics being sought. As an example, a greater resistance may improve linearity but noise performance may be degraded with respect to a smaller resistance. As another example, a smaller resistance may improve noise performance, but degrade conversion loss.

With respect to the above-described FIGS. 3A-3E, additional variations are possible and fall within the scope of the present disclosure. For example, a capacitor coupled between IF terminals can provide an improvement in linearity relative to the mixer of FIG. 2A. As an example, and as illustrated by the capacitor 388 in FIG. 3E, a capacitor can be coupled between differential ports on an RF-IF side balun of a mixer in combination with any of the features of FIG. 3A-3E. As another example, a series combination of a capacitor and a resistor can be coupled between differential ports on an RF-IF side balun of a mixer in combination with any of the features of FIG. 3A-3E. A capacitor or a series combination of a capacitor and a resistor can be coupled between differential ports on an RF-IF side balun of a mixer as an alternative to the embodiments of FIGS. 3A-3E.

Mixers in accordance with the embodiments shown in FIG. 3A-3E have been simulated with various process technologies. The simulations indicate that these embodiments have improved IIP3 by about 6 dBm and also improved output P1 dB by +1 dB for the process technologies relative to the mixer of FIG. 2A.

FIG. 4 illustrates an example simulation showing linearity improvement over a range of RF signal frequency (e.g., 5 GHz to 9 GHz) for disparate mixers. As illustrated in graph 410, linearity (e.g., IP3) for a mixer that includes capacitors in parallel with switching diodes (e.g., the mixer 300A of FIG. 3A) corresponding to curve 404 is improved relative to a mixer with just switching diodes (e.g., the mixer 200 of FIG. 2A) corresponding to curve 402. The graph 410 shows that a mixer with diodes in parallel with a series RC circuit (e.g., the mixer 300E of FIG. 3E) corresponding to the curve 406 has improved linearity relative to the mixers corresponding to the curves 402 and 404. The mixer corresponding to the curve 404 in FIG. 4 was implemented with 50 fF (femtofarad) capacitors. The mixer corresponding to the curve 406 was implemented with 50 fF capacitors and 90 Ohm resistors.

As illustrated, the IP3 for mixers corresponding to curve 404, 406 is improved relative to IP3 for the mixer corresponding to the curve 402. Additionally, graph 420 illustrates the P1 db linearity improvement over a same frequency range as the graph 410. Similar to the IP3 linearity improvement, the mixers corresponding to curves 404 and 406 have P1 db that is improved relative to the mixer corresponding to the curve 402.

The mixers disclosed herein can be implemented in a variety of electronic systems. For instance, the mixers discussed herein can be implemented in a receiver, a transmitter, and/or a transceiver. As one example, a mixer in accordance with any suitable principles and advantages discussed herein can receive a radio frequency signal from a low noise amplifier and down convert the radio frequency signal using a local oscillator signal from a local oscillator. As another example, a mixer in accordance with any suitable principles and advantages discussed herein can up convert a signal to radio frequency using a local oscillator signal from a local oscillator. The up converted signal can be provided to a power amplifier, for example. Aspects of the disclosure are applicable to any systems and/or devices that could benefit from a mixer with improved linearity.

Aspects of this disclosure can be implemented in various electronic devices. For instance, aspects of this disclosure can be implemented in any electronic device or electronic component that could benefit from a mixer with improved linearity. As an example, aspects of this disclosure can be implemented in any electronic device or electronic component with a transmitter, receiver, or transceiver that could benefit from a mixer with improved linearity. Examples of the electronic devices can include, but are not limited to, consumer electronic products, parts of the consumer electronic products, electronic test equipment, vehicular electronics systems, and so on. Examples of the electronic devices can include, but are not limited to, computing devices, communications devices, electronic household appliances, automotive electronics systems, etc. Further, the electronic devices can include unfinished products.

Throughout the description and the claims, the words "comprise," "comprising," "include," "including," and the like are to generally be construed in an inclusive sense, as opposed to an exclusive or exhaustive sense; that is to say, in the sense of "including, but not limited to." The word "coupled," as generally used herein, refers to two or more elements that may be either directly coupled to each other, or coupled by way of one or more intermediate elements. Likewise, the word "connected," as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural may also include the plural or singular, respectively. The word "or" in reference to a list of two or more items, is generally intended to encompass all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding whether these features, elements and/or states are included or are to be performed in any particular embodiment.

While certain embodiments of the inventions have been described, these embodiments have been presented by way of example only, and are not intended to limit the scope of the disclosure. Indeed, the novel methods, apparatus, and systems described herein may be embodied in a variety of other forms; furthermore, various omissions, substitutions and changes in the form of the methods, apparatus, and systems described herein may be made without departing from the spirit of the disclosure. For example, circuit blocks and/or circuit elements described herein may be deleted, moved, added, subdivided, combined, and/or modified. Each of these circuit blocks and/or circuit elements may be implemented in a variety of different ways. The accompanying claims and their equivalents are intended to cover any such forms or modifications as would fall within the scope and spirit of the disclosure.

What is claimed is:

1. A mixer for mixing an input signal with a local oscillator signal, the mixer comprising:
   switching circuit elements configured to be switched on and switched off based at least partly on the local oscillator signal, wherein the switching circuit elements are field effect transistors; and
   capacitors comprising a respective capacitor connected between a source and a drain of each of the field effect transistors, wherein the capacitors provide leakage current in the current path during a zero crossing transition time of the local oscillator signal to cause linearity of the mixer to be improved;
   wherein the mixer is configured to mix the input signal with the local oscillator signal to thereby frequency shift the input signal.

2. The mixer of claim 1, wherein the mixer is a double balanced mixer.

3. The mixer of claim 1, wherein a respective gate is electrically connected to a respective drain of each field effect transistor of the field effect transistors.

4. The mixer of claim 1, further comprising resistors arranged such that each of the switching elements is in parallel with a series circuit, the series circuit comprising a capacitor of the capacitors in series with a resistor of the resistors.

5. The mixer of claim 1, wherein the mixer is a passive mixer.

6. The mixer of claim 1, further comprising an input balun coupled to at least one of the switching circuit elements.

7. The mixer of claim 6, further comprising an additional capacitor coupled across differential ports of the input balun.

8. The mixer of claim 6, further comprising an output balun configured to provide the frequency shifted input signal.

9. The mixer of claim 1, wherein substantially no leakage current flows in the current path during a different time than the zero crossing transition time.

10. A mixer for mixing an input signal with a local oscillator signal, the mixer comprising:
    at least four diodes configured to switch based at least partly on the local oscillator signal, the at least four diodes being arranged in a ring; and
    capacitors, each of which is arranged in parallel with a respective diode of the at least four diodes arranged in the ring;
    wherein the mixer is configured to mix the input signal with the local oscillator signal to thereby frequency shift the input signal,
    wherein the at least four diodes and the capacitors are arranged such that leakage current flows across the at least four diodes during a zero crossing transition time of the local oscillator signal, and wherein substantially no leakage current flows across the at least four diodes during a different time.

11. The mixer of claim 10, wherein the mixer is a double balanced diode mixer.

12. The mixer of claim 10, further comprising resistors, each of which is included in a series RC circuit that also includes a capacitor of the capacitors and is in parallel with a diode of the diodes.

13. The mixer of claim 10, wherein each diode is a diode-connected field effect transistor.

14. The mixer of claim 10, further comprising an input balun coupled to at least one of the diodes.

15. The mixer of claim 10, wherein each capacitor is in parallel with a current path of a single diode of the at least four diodes.

16. A method for mixing an input signal with a local oscillator (LO) signal with improved linearity, the method comprising:

receiving, at inputs of a mixer, the input signal and the LO signal; and mixing, with switching elements of the mixer, the input signal and the LO signal to generate a frequency shifted input signal, wherein the switching elements and a plurality of capacitors are arranged such that leakage current flows across the switching elements during a zero crossing transition time of the LO signal to improve linearity of the mixer, wherein each capacitor of the plurality of capacitors is in parallel with a current path of a respective switching element of the switching elements.

17. The method of claim 16, wherein the switching elements are arranged in a ring.

18. The method of claim 16, wherein the mixer includes a series combination of a capacitor of the plurality of capacitors and a resistor in parallel with each of the switching elements.

19. The method of claim 16, further comprising providing the input signal to the mixer with an amplifier having a gain arranged to compensate for conversion gain of the mixer.

20. The method of claim 16, wherein substantially no leakage current flows across the switching elements during a different time than the zero crossing transition time.

* * * * *